United States Patent
Cho et al.

(10) Patent No.: US 7,476,622 B2
(45) Date of Patent: Jan. 13, 2009

(54) METHOD OF FORMING A CONTACT IN A SEMICONDUCTOR DEVICE

(75) Inventors: Yong-joon Cho, Seoul (KR); Young-hee Kim, Yongin (KR); Young-hwan Yun, Yongin (KR); Doo-heun Baek, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 748 days.

(21) Appl. No.: 10/712,052

(22) Filed: Nov. 14, 2003

(65) Prior Publication Data

US 2004/0110377 A1    Jun. 10, 2004

(30) Foreign Application Priority Data

Nov. 22, 2002    (KR) .................... 10-2002-0073049

(51) Int. Cl.
*H01L 21/302*    (2006.01)
(52) U.S. Cl. .................. 438/704; 438/689; 438/694; 438/700; 438/706; 438/745
(58) Field of Classification Search .............. 438/689, 438/700–706, 745, 694
See application file for complete search history.

(56) References Cited

U.S. PATENT DOCUMENTS

| | | | | |
|---|---|---|---|---|
| 4,625,391 A | * | 12/1986 | Sasaki .................. | 438/625 |
| 5,286,344 A | * | 2/1994 | Blalock et al. .......... | 438/723 |
| 5,565,384 A | * | 10/1996 | Havemann ............... | 438/702 |
| 5,779,927 A | * | 7/1998 | Lo ...................... | 216/84 |
| 5,817,562 A | * | 10/1998 | Chang et al. ........... | 438/305 |
| 5,851,878 A | * | 12/1998 | Huang .................. | 438/255 |
| 5,868,948 A | | 2/1999 | Fujii et al. | |
| 5,926,710 A | * | 7/1999 | Tseng .................. | 438/253 |
| 6,001,697 A | * | 12/1999 | Chang et al. ........... | 438/299 |
| 6,010,931 A | * | 1/2000 | Sun et al. ............. | 438/240 |
| 6,162,737 A | * | 12/2000 | Weimer et al. .......... | 438/738 |
| 6,245,650 B1 | | 6/2001 | Watanabe | |

(Continued)

FOREIGN PATENT DOCUMENTS

JP    08296067    11/1996

(Continued)

*Primary Examiner*—Shamim Ahmed
(74) *Attorney, Agent, or Firm*—Volentine & Whitt, PLLC

(57) ABSTRACT

A gate is formed on a device formation region of a semiconductor substrate, and source and drain regions are formed in the device formation region of the semiconductor substrate adjacent respective sides of the gate. The gate is formed to include a gate dielectric layer, a gate conductive layer and sidewall spacers located at respective sidewalls of the gate conductive layer. An etch stop layer is formed over the source region, the drain region and the sidewall spacers of the gate to obtain an intermediate structure, and a planarized first interlayer insulating film is formed over a surface of the intermediate structure. The first insulating layer is dry etched until the etch stop layer over the source region, the drain region and the sidewall spacers is exposed to form self-aligned contact holes in the first interlayer insulating over the source region and the drain region, respectively. The etch stop layer is then wet etched to remove the etch stop layer over the source region, the drain region and the sidewall spacers, and respective contact pads are formed by filling the self-aligned contact holes with conductive polysilicon.

17 Claims, 4 Drawing Sheets

U.S. PATENT DOCUMENTS

| | | |
|---|---|---|
| 6,342,416 B1 * | 1/2002 | Kim et al. .................. 438/239 |
| 6,379,577 B2 | 4/2002 | Akatsu et al. |
| 6,479,341 B1 * | 11/2002 | Lu ............................ 438/239 |
| 6,730,570 B2 * | 5/2004 | Shin et al. .................. 438/299 |
| 6,806,549 B2 * | 10/2004 | Tomita ....................... 257/510 |
| 2002/0061603 A1 | 5/2002 | Eto |
| 2002/0064968 A1 * | 5/2002 | Kim et al. .................. 438/782 |
| 2002/0168830 A1 * | 11/2002 | DeBoer et al. .............. 438/253 |
| 2004/0166678 A1 | 8/2004 | Hall |
| 2006/0043569 A1 | 3/2006 | Benson et al. |
| 2006/0134808 A1 | 6/2006 | Summerfelt et al. |

FOREIGN PATENT DOCUMENTS

| | | |
|---|---|---|
| JP | 2000173999 | 6/2000 |
| JP | 2001-156038 | 6/2001 |
| JP | 2002-025964 | 1/2002 |
| JP | 2004260177 | 9/2004 |
| KR | 100126784 | 10/1997 |
| KR | 1998-0005622 | 3/1998 |
| KR | 1020030095589 | 12/2003 |
| KR | 1020050014440 | 2/2005 |

* cited by examiner

METHOD OF FORMING A CONTACT IN A SEMICONDUCTOR DEVICE

BACKGROUND OF THE INVENTION

1. Field of the Invention

The present invention relates to a method of fabricating a semiconductor device, and more particularly, to a self-aligned contact method of forming a contact for a source/drain region of the semiconductor device.

A claim of priority is made to Korean Patent Application No. 2002-73049, filed on 22 Nov. 2002, which is incorporated herein in its entirety by reference.

2. Description of the Related Art

As semiconductor devices become highly integrated, the distance between device components decreases, making it difficult to employ conventional patterning techniques. For example, when a contact is formed in an active region of a dynamic random access memory (DRAM) device, a contact area is so small that many problems are encountered during patterning of layers of the device. As such, a technique known as self-aligned contact formation has been introduced in an effort to combat the problems associated with the patterning of extremely small dimensions.

FIGS. 1 and 2 are cross-sectional diagrams for explaining a conventional self-aligned contact formation process. Referring first to FIG. 1, an isolation insulating film 1110 is formed in a semiconductor substrate 100 to define a device formation region. A gate 1120 is formed on the semiconductor substrate 100. The gate 1120 includes a gate dielectric film (not shown), a gate conductive film 1123 and 1125, a mask insulating film 1127 and sidewall spacers 1129. A source region 1105a and a drain region 1105b are formed at respective sides of the gate 1120. An etch stop 1140 is formed on the resultant structure of the semiconductor substrate 100, a first interlayer insulating film 1150 is formed on the etch stop 1140, and a self-aligned contact hole 1160a is formed in the first interlayer insulating film 1150 through a predetermined patterning process.

Referring to FIG. 2, the etch stop 1140 remaining in the self-aligned contact hole 1160a is removed by dry etching, thereby exposing the source region 1105a and the drain region 1105b. The contact hole 1160a is filled with conductive polysilicon (not shown) to form a contact pad.

In the conventional self-aligned contact formation process, over etching of the etch stop 1140 remaining in the contact hole 1160a is needed to sufficiently expose the underlying surface of the silicon substrate 100. Unfortunately, due to characteristics of dry etching, the over etching can damage the silicon substrate 100, which in turn can increase the contact resistance of the contact hole 1160a. The result can be contact failures and increased leakage current.

SUMMARY OF THE INVENTION

According to one aspect of the present invention, there is provided a method for fabricating a semiconductor device in which a gate is formed on a device formation region of the semiconductor substrate, and source and drain regions are formed in the device formation region of the semiconductor substrate adjacent respective sides of the gate. The gate is formed to include a gate dielectric layer, a gate conductive layer and sidewall spacers located at respective sidewalls of the gate conductive layer. An etch stop layer is formed over the source region, the drain region and the sidewall spacers of the gate to obtain an intermediate structure, and a planarized first interlayer insulating film is formed over a surface of the intermediate structure. The first insulating layer is dry etched until the etch stop layer over the source region, the drain region and the sidewall spacers is exposed to form self-aligned contact holes in the first interlayer insulating over the source region and the drain region, respectively. The etch stop layer is then wet etched to remove the etch stop layer over the source region, the drain region and the sidewall spacers, and respective contact pads are formed by filling the self-aligned contact holes with conductive polysilicon.

According to the invention, the etch stop layer is removed by wet etching when the contact holes are formed, to thereby avoid damage to the source and the drain regions and the formation of defects in the surface of the semiconductor substrate. Thus, electric characteristics such as leakage current and contact resistance can be improved.

BRIEF DESCRIPTION OF THE DRAWINGS

The above objects and advantages of the present invention will become readily apparent form the detailed description that follows, with reference to the accompanying drawings, in which.

DETAILED DESCRIPTION OF THE PREFERRED EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete and will fully convey the concept of the invention to those skilled in the art.

FIGS. 3 through 7 are sectional views for explaining sequential processes of a method of fabricating a semiconductor device according to the present invention.

Figure 1:
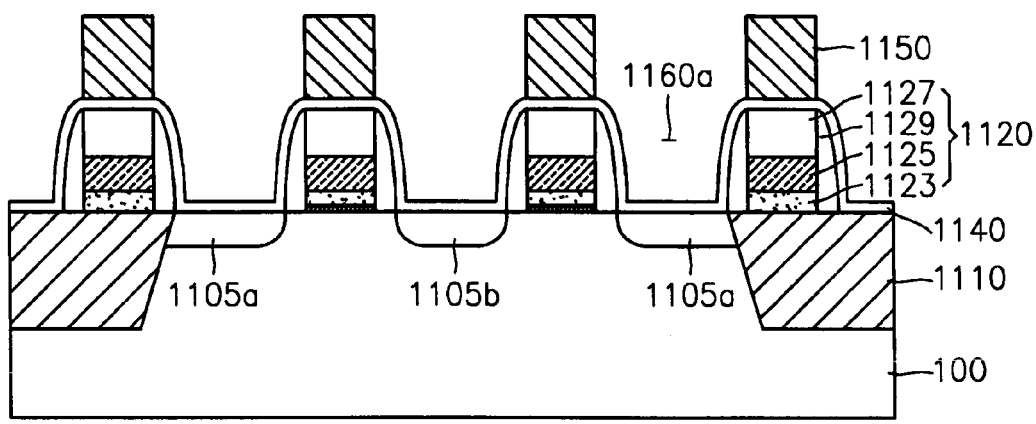
FIGS. 1 and 2 are sectional views for explaining a conventional self-aligned contact formation method used in the fabrication of a semiconductor device.
Figure 2:
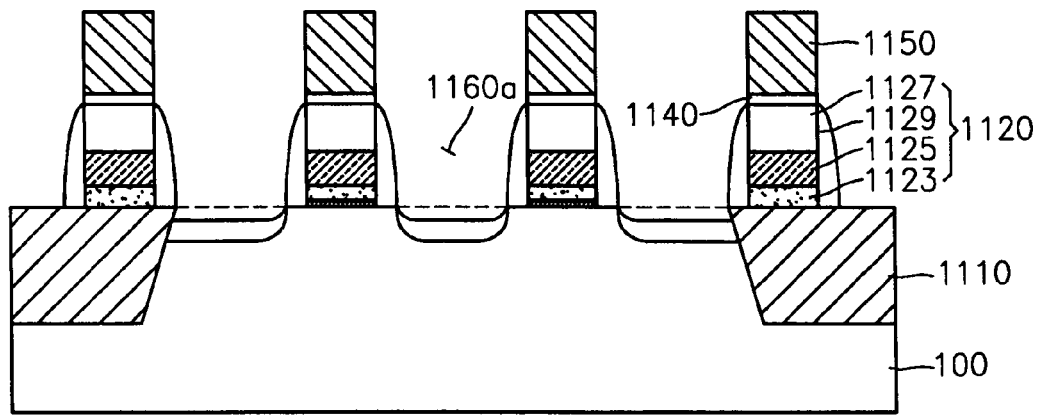
Figure 3:
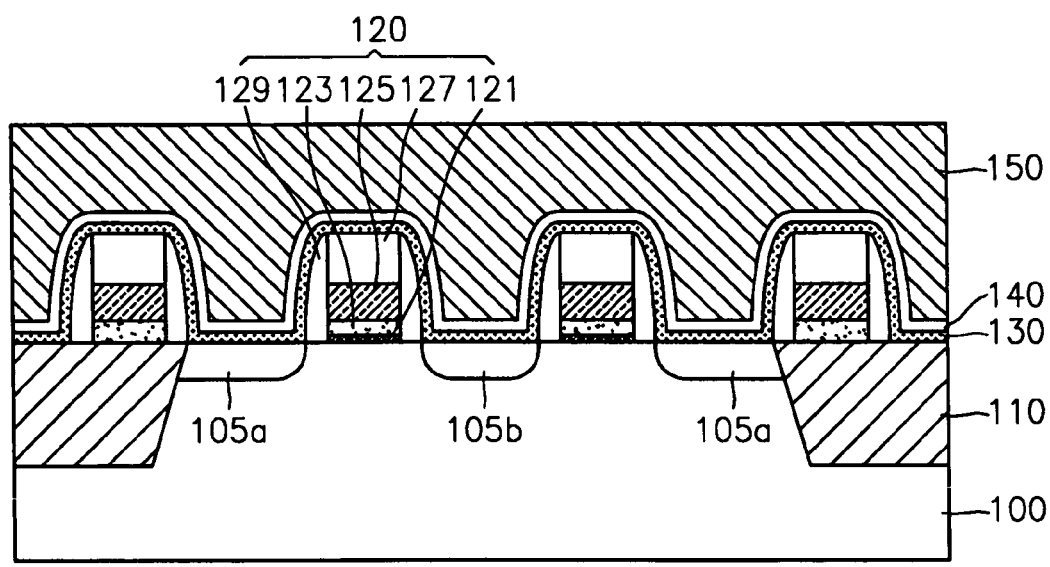
FIGS. 3 through 7 are sectional views for explaining a self-aligned contact formation method used in the fabrication of a semiconductor device according to the present invention.

Referring to FIG. 3, an isolation insulating film 110 is formed in a semiconductor substrate 100 by using known device isolation technology to define a device formation region. A gate dielectric film 121 is formed in the device formation region, and gate conductive films 123 and 125 and a mask insulating film 127 are sequentially formed on the gate dielectric film 121. In this embodiment, the gate dielectric film 121 is either a silicon oxide film or a silicon nitride oxide film SiON. The gate conductive films 123 and 125 are formed by combining conductive polysilicon with metal silicide. In addition, the mask insulating film 127 is a silicon nitride film formed by chemical vapor deposition (CVD).

A photoresist (not shown) is formed on the mask insulating film 127. The mask insulating film 127 is etched to form a hard mask 127 by dry etching in which the patterned photoresist is used as a mask. After the photoresist mask is removed, the gate conductive films 123 and 125 are etched by dry etching using the hard mask 127 as a mask. Then, a gate 120 is formed by forming an insulating film spacer 129 made of a silicon nitride film at the sidewalls of the hard mask 127 and the gate conductive films 123 and 125. Hereinafter, the hard mask 127 is denoted by the same reference numeral as the mask insulating film.

A source region 105a and a drain region 105b are formed on the semiconductor substrate 100 at both sides of the gate 120 by ion implantation in which the gate 120 is used as a mask. Here, a lower oxide film (not shown) may be formed on the source region 105a and the drain region 105b of the device formation region. The lower oxide film may be formed by thermal oxidation or may be the gate dielectric film 121 remaining in the device formation region.

A buffer layer 130 and an etch stop layer 140 are sequentially formed on the whole surface of the semiconductor substrate 100. The buffer layer 130 serves as a stress buffering layer between the etch stop 140 and the semiconductor substrate 100 in order to prevent stress from being applied to the semiconductor substrate 100 when the etch stop 140 is formed. If an oxide film remains on the source region 105a and the drain region 105b, it may not be necessary to form the buffer layer 130. The buffer layer 130 is a silicon oxide layer formed by chemical vapor deposition (CVD). In particular, it is desirable that the buffer layer 130 be a mid-temperature oxide (MTO) film that is formed by low pressure chemical vapor deposition and is deposited at a temperature of 500° C. through 600° C. This is because the buffer layer 130 can exhibit a high etch rate and a high etching selectivity in an etch solution, i.e., ammonium hydroxide (NH4OH) solution. The etch stop 140 is a silicon nitride film formed by chemical vapor deposition (CVD) and has a high etching selectivity to the first interlayer insulating film 150 as the silicon oxide film. Thus, the etch stop 140 is effectively used when the contact hole is formed.

Still referring to FIG. 3, a first interlayer insulating film 150 is thickly formed on the whole surface of the semiconductor substrate 100, and its surface is planarized by a known planarization process. If the hard mask 127a and the insulating film spacer 129 are nitride films in order to perform a self-aligned contact formation process, it is desirable that the first interlayer insulating film 150 be a silicon oxide film formed by chemical vapor deposition (CVD) so that the first interlayer insulating film 150 can have a high etching selectivity with respect to the hard mask 127 and the insulating film spacer 129 as the silicon nitride films. In particular, it is desirable that the first interlayer insulating film 150 be a silicon oxide film formed by high-density plasma chemical vapor deposition (HDP CVD) because the deposition is executed rapidly, and the step coverage is superior. When the etch stop 140 and the buffer layer 130 are removed by wet etching, the first interlayer insulating film 150 formed by HDP CVD is etched much slower than the etch stop 140 and the buffer layer 130 by an etchant solution. Thus, damage to a contact pattern by wet etching can be reduced.

The first interlayer insulating film 150 can be planarized by dry etching-back or chemical mechanical polishing (CMP). However, it is desirable that chemical mechanical polishing be used because it causes less damage to the semiconductor substrate 100.

Figure 6:
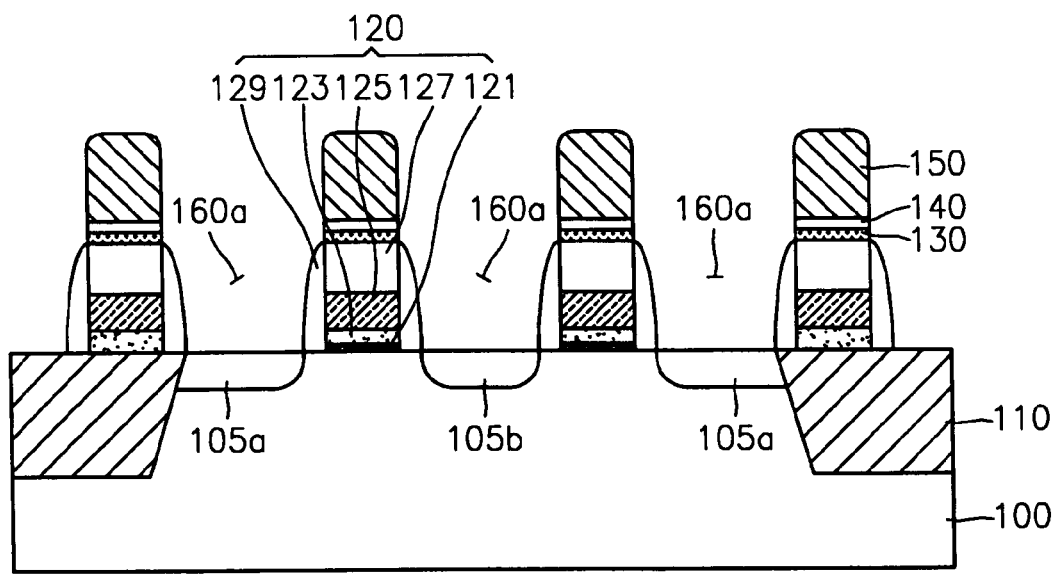

After the planarization process is completed, it is desirable that the remaining thickness of the first interlayer insulating film 150 be higher than a predetermined height from an upper portion of the gate 120, thereby easily forming a self-aligned contact hole 160a of FIG. 6 when self-aligned contact hole etching is performed.

Figure 4:
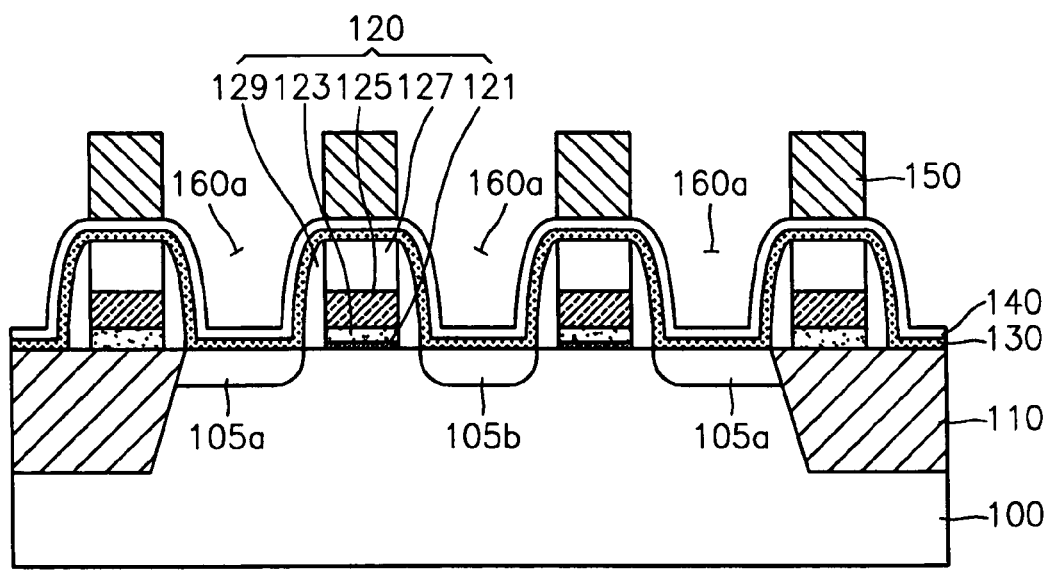

Referring to FIG. 4, a photoresist pattern (not shown) is formed on the planarized first interlayer insulating film 150. The self-aligned contact hole 160a is formed by etching the first interlayer insulating film 150 by dry etching in which the photoresist pattern is used as a mask. The line width of the self-aligned contact hole 160a is larger than the source region 105a or the drain region 106b. Here, an upper portion of the etch stop 140 serves as an etching stopping boundary, and thus etching of the self-aligned contact hole 160a is stopped on the etch stop 140. Then, the insulating film spacer 129 partially serves as a mask, and thus the self-aligned contact hole 160a is formed at sides of the insulating film spacer 129.

Figure 5:
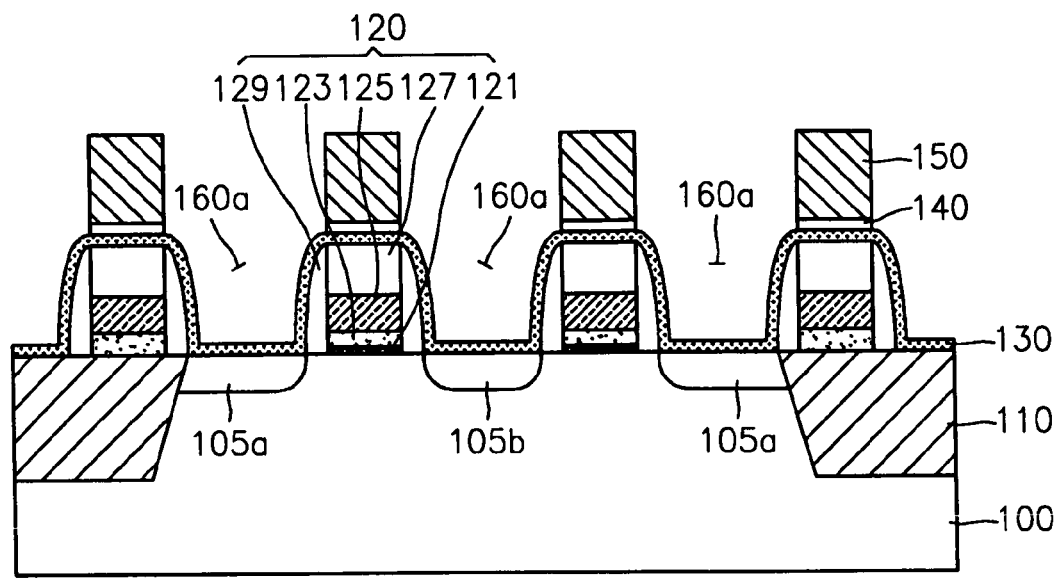

FIGS. 5 and 6 will be described with reference to the flowchart of FIG. 8.

Referring to FIGS. 5 through 8, the etch stop 140 is removed by wet etching to expose the buffer layer 130. An upper portion of the etch stop 140 is cleaned by removing many residual products and polymers remaining on the semiconductor substrate 100 by using diluted hydrofluoric acid (HF) solution (step S1). Then, the silicon nitride film etch stop 140 is removed using an etching solution including phosphoric acid $H_3PO_4$ (step S2). Here, it is desirable that the etching solution including phosphoric acid $H_3PO_4$ be at a temperature of 120° C. to 150° C. to improve etching conditions, and have a density of 50 wt % to 85 wt % to obtain an appropriate etching rate. In general, the etching rate of the silicon oxide film (e.g., HDP silicon oxide film, HTO and MTO, or the like constituting the first interlayer insulating film 150) in the etching solution including phosphoric acid $H_3PO_4$ is 1Å through 4Å per minute.

Figure 7:
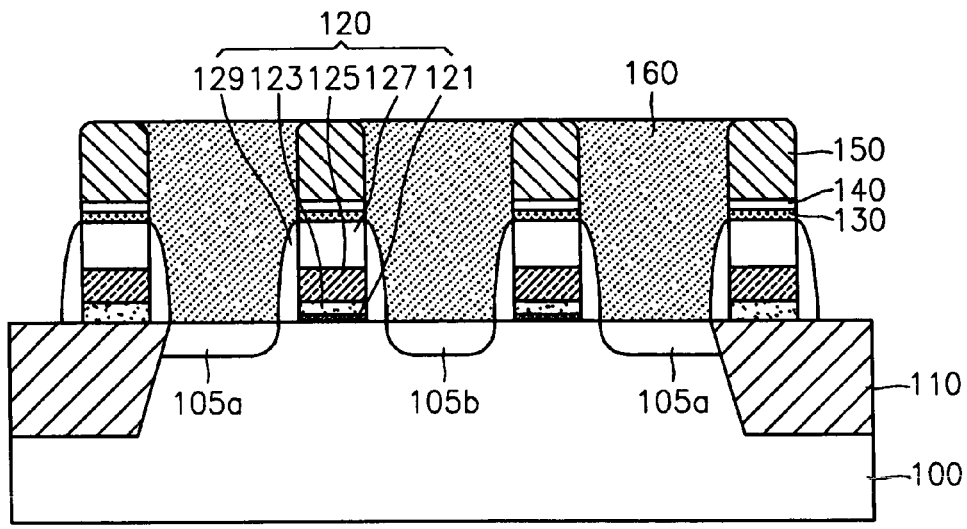
Figure 8:
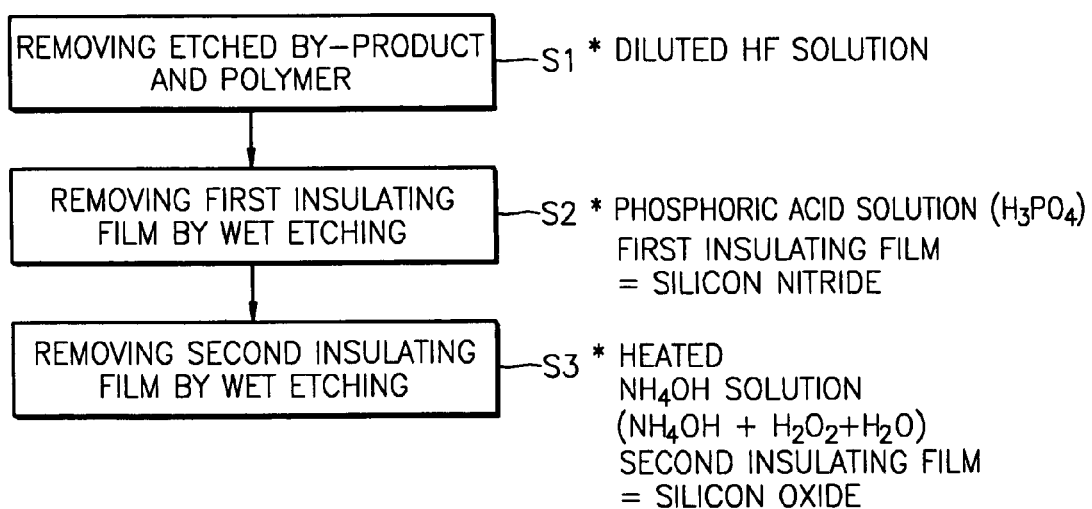
FIG. 8 is a flowchart showing processes of the self-aligned contact formation method according to the present invention.

Referring to FIGS. 6 through 8, the buffer layer 130 is removed by wet etching to expose the semiconductor substrate 100 of the source region 105a and the drain region 105b (step S3). Here, an etching solution is used to etch the silicon oxide film buffer layer and is an ammonium hydroxide ($NH_4OH$) solution at a temperature of 30Å to 80Å. Thus, an etching rate of the silicon oxide film increases, and the time required by the entire process can be greatly reduced. While an etching process is in progress, the first interlayer insulating film 150, which is a silicon oxide film formed by HDP CVD, is also etched. However, an etching rate of the first interlayer insulating film 150 is about 2Å per minute. Since the etching rate of the first interlayer insulating film 150 is slower than that of the buffer layer 130 as the etching rates of a mid-temperature oxide (MTO) film, the buffer layers 130, and the first interlayer insulating film 150 are about 5Å and hundreds of Å respectively while thousands of Å of the first interlayer insulating film 150 is etched per minute. Therefore, this wet etching hardly causes damage to the contact hole morphology considering changes in sizes of the contact hole.

The etching solution should have a high etching rate with respect to the buffer layer 130 and a low etching rate with respect to the first interlayer insulating film 150. Thus, the etching solution is formed by combining ammonium hydroxide (NH4OH), hydrogen peroxide (H2O2), and deionized water. In particular, the etching solution of the oxide film should include 0.1 wt % through 1.0 wt % of ammonium hydroxide, and 4.0 wt % through 7.0 wt % of hydrogen peroxide. Thus, when the buffer layer 130 is etched, the first interlayer insulating film 150 can firmly maintain the self-aligned contact hole 160a. The etching solution including ammonium hydroxide (NH4OH) does not cause damage to the silicon substrate of the semiconductor substrate 100, and thus the source region 105a and the drain region 105b can be exposed without causing any defects or stress.

Referring to FIG. 7, sufficient conductive polysilicon is formed on the whole surface of the semiconductor substrate 100 to fully fill the self-aligned contact hole 160a. Then, the conductive polysilicon is removed by chemical mechanical polishing it until it reaches the level of the upper portion of the first interlayer insulating film 150. Then, the self-aligned contact hole 160a is filled with the conductive polysilicon, and thus a contact fill or a contact pad 160 is formed.

As described above, the method for fabricating a semiconductor device according to the present invention removes the etch stop 140 and the buffer layer 130 by wet etching when the contact hole is formed, and thus an additional cleaning process is not needed.

That is, when the contact hole is formed according to the conventional method, the etch stop 140 is removed by wet etching to expose the semiconductor substrate 100, and then is further cleaned to remove polymers or residual particles due to wet etching. Thus, the time required for forming the contact hole is increased.

However, in the present invention, the etch stop 140 and the buffer layer 130 are etched by wet etching. In particular, the ammonium hydroxide ($NH_4OH$) solution, which is used to etch the buffer layer 130, also serves as a cleaning solution, and thus an additional cleaning process is not needed. As a result, the time required for forming the contact hole is reduced to about half that required for the conventional method.

According to the present invention, the etch stop layer at the bottom of the contact hole is removed by wet etching when the contact pads connecting the source region with the drain region are formed, to thereby avoid damage to the source and the drain regions and the formation of defects in the surface of the semiconductor substrate. Thus, electric characteristics such as leakage current and contact resistance can be improved.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for fabricating a semiconductor device, the method comprising:
    forming a gate on a device formation region of a semiconductor substrate, and forming source and drain regions in the device formation region of the semiconductor substrate adjacent respective sides of the gate, wherein the gate comprises a gate dielectric layer, a gate conductive layer and sidewall spacers located at respective sidewalls of the gate conductive layer;
    sequentially forming a buffer layer and an etch stop layer over the source region, the drain region and the gate to obtain an intermediate structure;
    forming a planarized first interlayer insulating film over a surface of the intermediate structure, wherein the first interlayer insulating film is a silicon oxide film formed by high-density plasma chemical vapor deposition;
    dry etching the first interlayer insulating film until portions of the etch stop layer disposed over the source region, the drain region and the sidewall spacers are exposed to form self-aligned contact holes in the first interlayer insulating film over the source region and the drain region, respectively;
    wet etching the etch stop layer to remove the portions of the etch stop layer disposed over the source region, the drain region and the sidewall spacers; and
    forming respective contact pads by filling the self-aligned contact holes with conductive polysilicon.

2. The method of claim 1, wherein the gate further comprises a hard mask formed on a surface of the gate conductive layer.

3. The method of claim 1, wherein the sidewall spacer and the etch stop layer are formed of silicon nitride by chemical vapor deposition.

4. The method of claim 1, further comprising:
    following wet etching of the etch stop layer, wet etching the buffer layer to remove the buffer layer from the source region, the drain region and the sidewall spacers.

5. The method of claim 4, wherein the buffer layer is formed of silicon oxide by thermal oxidation.

6. The method of claim 5, wherein the buffer layer is formed of a mid-temperature oxide (MTO) by low pressure chemical vapor deposition.

7. The method of claim 1, wherein the etch stop layer is formed of silicon nitride by chemical vapor deposition.

8. The method of claim 1, wherein the wet etching of the etch stop layer comprises:
    removing oxide film remnants on the etch stop layer by wet etching by with an oxide etchant; and
    removing the etch stop layer using an oxide etching solution or a nitride etching solution.

9. The method of claim 8, wherein the oxide etching solution includes a concentration of diluted hydrofluoric acid (HF) ranging from about 0.01 wt % through 0.001 wt %.

10. The method of claim 8, wherein the nitride etching solution includes phosphoric acid $H_3PO_4$.

11. The method of claim 10, wherein the concentration of phosphoric acid $H_3PO_4$ in the nitride etching solution ranges from about 50 wt % through 80 wt %.

12. The method of claim 4, wherein the buffer layer is removed using an etching solution including ammonium hydroxide ($NH_4OH$), hydrogen peroxide ($H_2O_2$), and deionized water.

13. The method of claim 12, wherein the etching solution includes a concentration of ammonium hydroxide ($NH_4OH$) ranging from about 0.1 wt % through 1.0 wt %.

14. The method of claim 12, wherein the etching solution includes a concentration of hydrogen peroxide ($H_2O_2$) ranging from about 4.0 wt % through 7.0 wt %.

15. The method of claim 12, wherein the wet etching is performed at a temperature of 30° C. through 80° C.

16. The method of claim 1, wherein the forming of the respective contact pads comprises:
    filling the self-aligned contact holes by depositing the conductive polysilicon over an entirety of the surface of the semiconductor substrate; and
    chemical mechanical polishing the conductive polysilicon in the self-aligned contact holes down to a level of an upper portion of the first interlayer insulating film.

17. A method for fabricating a semiconductor device, the method comprising:
    forming a gate on a device formation region of a semiconductor substrate, and forming source and drain regions in the device formation region of the semiconductor substrate adjacent respective sides of the gate, wherein the gate comprises a gate dielectric layer, a gate conductive layer and first and second sidewall spacers located at first and second sidewalls of the gate conductive layer;
    forming a buffer layer over the source region, the drain region and the first and second sidewall spacers of the gate;
    forming an etch stop layer on the buffer layer to obtain an intermediate structure;
    forming a first interlayer insulating film over the intermediate structure, wherein the first interlayer insulating film has an etching rate slower than the etching rate of the buffer layer relative to a defined dry etching process;

performing the dry etching process to etch the first interlayer insulating film until portions of the etch stop layer disposed over the source region, the drain region and the first and second sidewall spacers are exposed to form self-aligned contact holes in the first interlayer insulating film over the source region and the drain region, respectively;

wet etching the buffer layer and the etch stop layer to expose the source region, the drain region and the first and second sidewall spacers; and forming respective contact pads by filling the self-aligned contact holes with conductive polysilicon.

* * * * *